(12) United States Patent
Zhang et al.

(10) Patent No.: US 7,238,561 B2
(45) Date of Patent: Jul. 3, 2007

(54) METHOD FOR FORMING UNIAXIALLY STRAINED DEVICES

(75) Inventors: Da Zhang, Austin, TX (US); Veer Dhandapani, Round Rock, TX (US); Brian Goolsby, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 175 days.

(21) Appl. No.: 11/195,510

(22) Filed: Aug. 2, 2005

(65) Prior Publication Data
US 2007/0032003 A1 Feb. 8, 2007

(51) Int. Cl.
*H01L 21/336* (2006.01)
(52) U.S. Cl. .............. 438/197; 438/296; 438/481; 438/E21.431
(58) Field of Classification Search ............. 438/149, 438/197, 296, 481
See application file for complete search history.

(56) References Cited

U.S. PATENT DOCUMENTS 6,621,131 B2   9/2003  Murthy
2005/0093084 A1*  5/2005  Wang et al. ............... 257/410

\* cited by examiner

*Primary Examiner*—Dung A. Le
(74) *Attorney, Agent, or Firm*—John A. Fortkort; Fortkort & Houston P.C.

(57) ABSTRACT

A method for making a semiconductor device is provided herein. In accordance with the method, a semiconductor structure is provided which comprises a substrate (201) with a gate structure (209) disposed thereon, wherein the gate structure comprises a gate electrode (227) and at least one spacer structure (215, 217), and wherein the substrate comprises a first semiconductor material. A first trench (231) is created in the substrate adjacent to the gate structure through the use of a first etch. The gate electrode is then etched with a second etch. Preferably, the minimum cumulative reduction in thickness of the gate electrode from the first and second etches is $d_g$, the maximum depth of the first and second trenches after the first and second etches is $d_t$, and $d_g \geq d_t$.

19 Claims, 4 Drawing Sheets

METHOD FOR FORMING UNIAXIALLY STRAINED DEVICES

FIELD OF THE DISCLOSURE

The present disclosure relates generally to semiconductor devices, and more particularly to methods for making semiconductor devices having stressed channel layers.

BACKGROUND OF THE DISCLOSURE

Despite the significant improvements in semiconductor device speeds over the last decade, the need for devices with improved performance characteristics persists. In particular, the introduction of more powerful software applications and operating systems has created a need for chips and other semiconductor devices that can perform a larger number of calculations in less time. Since the speed of semiconductor devices is governed in part by carrier transport properties, a great deal of attention has been focused in the art on methods for improving the carrier transport properties of semiconductor devices.

One method for improving the carrier transport properties of a semiconductor device is through the creation of a strained silicon channel layer in the device. Strain may be imparted to the channel layer by modifying its lattice structure. For example, if the channel layer is formed by depositing a layer of silicon over another material, such as SiGe, which has a comparatively larger lattice spacing, the silicon atoms in the channel layer will "stretch" to line up with the underlying Si and Ge atoms, thereby inducing strain in the channel layer. The presence of such strain has an advantageous effect on the transport properties of the channel layer. In particular, electrons and holes may experience less resistance, and hence greater mobility, in strained silicon as compared to unstrained silicon. Consequently, devices utilizing a well-defined strained silicon channel layer typically have higher drive than their unstrained counterparts.

One method known in the art for inducing channel strain in a semiconductor device is through the epitaxial growth of a strained layer in pre-recessed source/drain regions of the device. This may be accomplished by etching suitable trenches in the device, and then backfilling the trenches through epitaxial growth. The epitaxial layer is formed from a material which has a lattice constant which is different from the lattice constant of the substrate, thereby inducing strain in the device channel region, with the attendant improvement in carrier transport properties. Since it is desirable not to use a gate hard mask during this procedure, the gate region of the semiconductor device is exposed to the processing conditions attendant to source/drain etching and epitaxy. Unfortunately, at the conclusion of these processes, the profile of the gate electrode is often found to be distorted.

There is thus a need in the art for a method for making transistors with strained semiconductor channel layers that does not suffer from the aforementioned infirmity. In particular, there is a need in the art for a method for making semiconductor devices with strained channel layers through a source/drain epitaxial growth process that does not result in distortions in the profile of the gate electrode. There is further a need in the art for transistors made by such a process. These and other needs may be met by the devices and methodologies described herein.

DETAILED DESCRIPTION

In one aspect, a method for making a semiconductor device is provided herein. In accordance with the method, a semiconductor structure is provided which comprises a substrate with a gate structure disposed thereon, wherein the gate structure comprises a gate electrode and at least one spacer structure, and wherein the substrate comprises a first semiconductor material. A first trench is created in the substrate adjacent to the gate structure through the use of a first etch. The gate electrode is then etched with a second etch. In a preferred embodiment, the maximum cumulative reduction in thickness of the substrate adjacent to the gate structure from the first and second etches is $d_r$, the minimum cumulative reduction in thickness of the gate electrode from the first and second etches is $d_g$, and $d_g \geq d_r$.

In another aspect, a method for making a semiconductor device is provided. In accordance with the method, a semiconductor structure is provided which comprises a substrate with a gate structure disposed thereon, the gate structure comprising a gate electrode and at least one spacer structure. First and second trenches are created in the substrate on first and second sides of the gate electrode, respectively, through the use of a first etch. The gate electrode is then etched with a second etch. The minimum cumulative reduction in thickness of the gate electrode from the first and second etches is $d_g$, and the maximum depth of the first and second trenches after the first and second etches is $d_r$, and wherein $d_g \geq d_r$.

These and other aspects of the present disclosure are described in greater detail below.

It has now been found that the aforementioned problem with distortion of gate electrode profiles can arise from insufficient etching of the gate electrode during the source/drain etching process used to form a stressed channel layer.

As a result of the insufficient etching, the gate electrode undergoes excessive growth during the subsequent epitaxial growth process, thereby resulting in distortion of the gate electrode. This phenomenon is often termed "mushrooming", due to the shape that the electrode can assume when it grows over the top of the adjacent spacer structures. It has further been found that this problem can be overcome by ensuring sufficient etching of the gate electrode relative to the source/drain regions. This may be accomplished, for example, by using a suitable secondary etch (preferably following a primary etch that is used in the creation of the source/drain regions) that preferentially etches the gate electrode. Such a secondary etch may be used to compensate for any difference in etching between the gate electrode and the source/drain regions that may occur during the primary etch.

Figure 1:
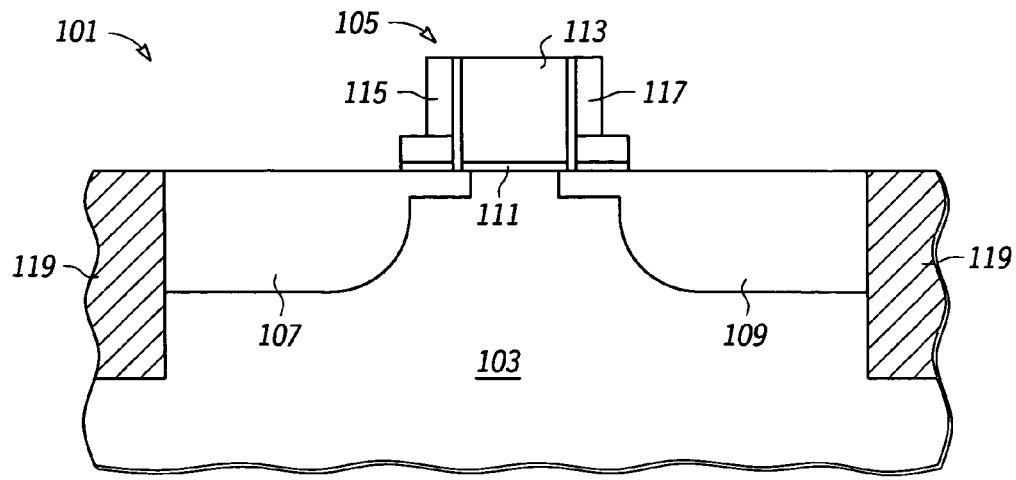
FIG. 1 is an illustration of one step in a prior art method for making a transistor with a strained channel layer.
Figure 2:
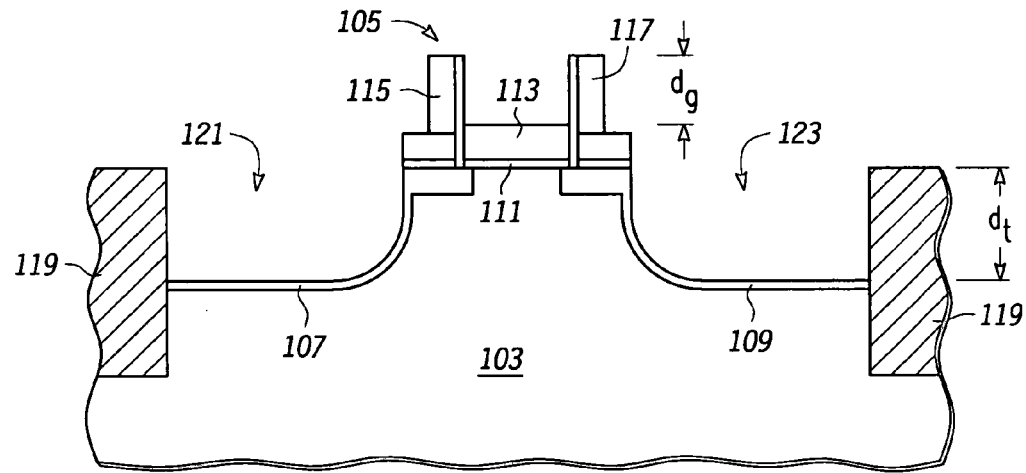
FIG. 2 is an illustration of one step in a prior art method for making a transistor with a strained channel layer.
Figure 3:
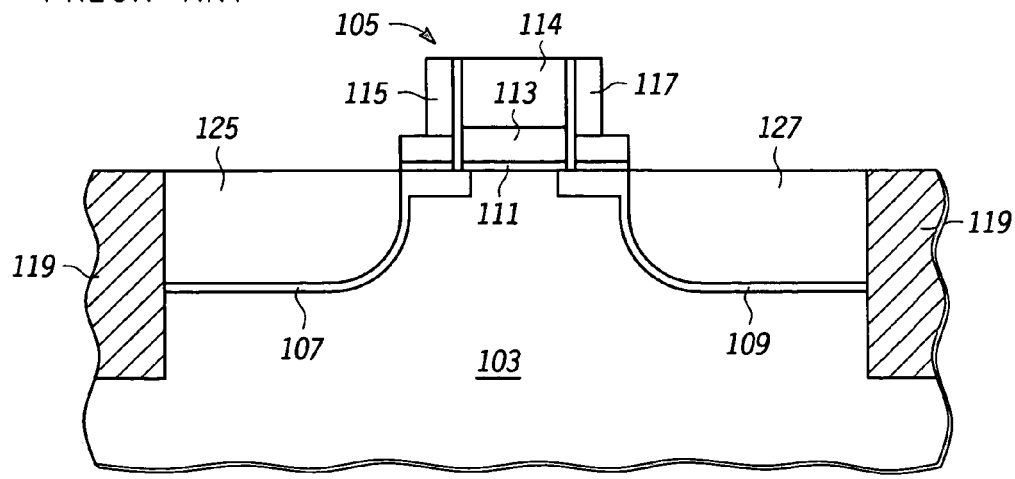
FIG. 3 is an illustration of one step in a prior art method for making a transistor with a strained channel layer.

The methodology described herein may be better understood by first considering how distortion of the gate electrode profile may occur in the prior art process used for making strained transistors. FIGS. 1-3 illustrate some of the relevant steps in this process. As shown in FIG. 1, a semiconductor structure 101 is provided which comprises a semiconductor substrate 103 having a gate structure 105 disposed thereon. Implant regions 107, 109 have been created by ion implantation on either side of the gate structure 105. The gate structure 105 comprises a gate dielectric 111 and a gate electrode 113, the latter of which is bounded by adjacent spacer structures 115, 117. The semiconductor structure 101 further comprises a plurality of field isolation regions 119.

As shown in FIG. 2, the semiconductor structure 101 is then subjected to dry etching to remove a portion of the implant regions 107, 109, thereby creating first 121 and second 123 trenches adjacent to the gate structure 105. The dry etch also removes a portion of the gate electrode 113. Notably, the gate electrode 113 is not necessarily etched at the same rate as implant regions 107, 109. Indeed, it has been determined that the gate electrode 113 is often etched at a slower rate than implant regions 107, 109. As a result, the depth $d_g$ of the trench formed in the gate electrode by the dry etch is frequently less than the depth $d_t$ of the trenches 121, 123 formed for the source and drain regions.

Referring now to FIG. 3, the semiconductor structure is subjected to epitaxial growth to form source 125 and drain 127 regions. The epitaxy process may proceed with in-situ doping. This process also results in film growth on the gate electrode 113, as indicated by the formation of new gate electrode region 114. So long as $d_g \geq d_t$ (and assuming an equal rate of growth in the gate electrode 113 and the source 125 and drain 127 regions), when epitaxial growth of the source 125 and drain 127 regions has concluded, the surface of the gate electrode 113 will be even with, or somewhat lower than, the adjacent spacer structures 115, 117.

Figure 4:
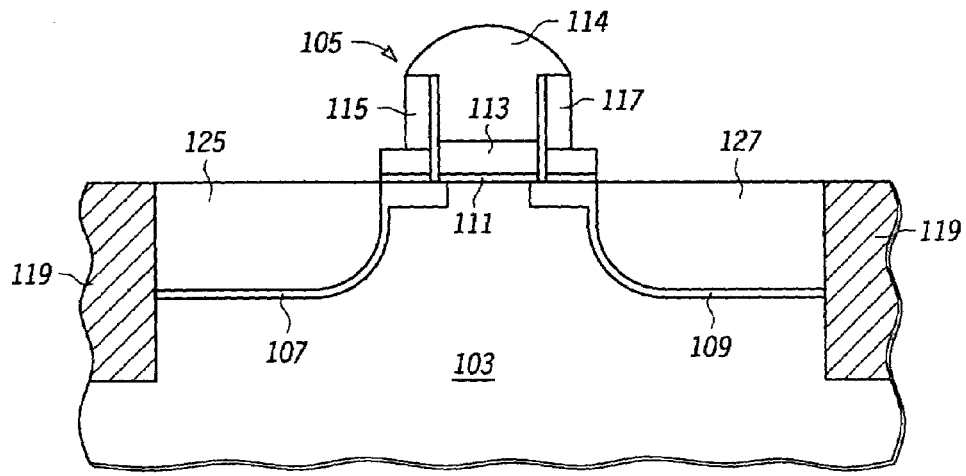
FIG. 4 is an illustration of the "mushrooming" problem encountered in the prior art method of FIGS. 1-3.

However, as previously noted, it is frequently the case that the gate electrode etches at a different rate than the implant regions 107, 109, which can result in the situation where $d_g < d_t$. In such situations, the epitaxial growth may not result in the formation of a new gate electrode region 114 having a planar surface as depicted in FIG. 3. Rather, the epitaxial growth process may cause the gate electrode region 114 to extend above the adjacent spacer structures 115, 117, thereby distorting the profile of the gate electrode 113. Since the film growth process on the gate electrode 113 is typically isotropic, the portion of the new gate electrode region 114 which extends above the adjacent spacer structures 115, 117 often forms as a mushroom-shaped protrusion. This situation is depicted in FIG. 4. The distortion of the profile of the gate electrode 113 in this manner (i.e., through mushrooming) adversely affects its physical and electrical properties. For example, the device fringing capacitance increases when mushrooming takes place, which adversely affects device speed. Mushrooming also has a negative impact on product yield, due to the higher probability of gate-to-source/drain shorting.

Figure 5:
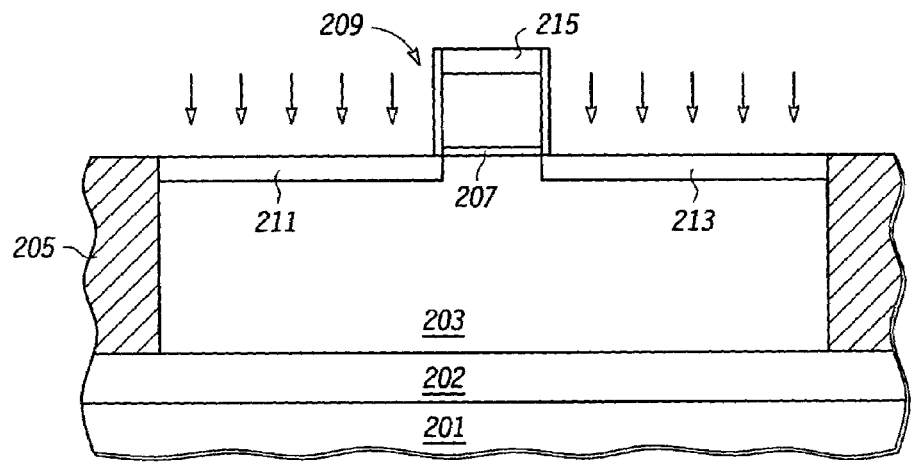
FIG. 5 is an illustration of one step in a method for making a transistor with a strained channel layer in accordance with the teachings herein.

FIGS. 5-10 illustrate a first non-limiting embodiment of a methodology in accordance with the teachings herein. In accordance with this particular embodiment, as shown in FIG. 5, a semiconductor structure is provided. The particular semiconductor structure illustrated is a Semiconductor-On-Insulator (SOI) wafer, and hence comprises a substrate 201 with a buried oxide layer 202 disposed thereon, and a semiconductor layer 203 comprising a first semiconductor material which is disposed over the buried oxide layer 202. Of course, it will be appreciated that the methodologies described herein are not particularly limited to any specific type of semiconductor structure, and are applicable to a variety of other types of semiconductor structures, including bulk wafers.

The semiconductor layer 203 is preferably monocrystalline. In some embodiments, the thickness of the semiconductor layer 203 may be increased by epitaxial growth after formation of the SOI wafer. Such a process replicates the crystalline morphology of the existing semiconductor layer. The semiconductor layer 203 may comprise silicon, germanium, SiGe, or other types of semiconductor materials.

A plurality of field isolation regions 205 may optionally be formed in the semiconductor layer 203. The field isolation regions 205 may be used to isolate wells of different conductivity types, and may also be used to isolate adjacent transistors. The field isolation regions 205 may be, for example, shallow trench isolation (STI) regions that may be formed by etching a trench into the semiconductor layer 203 and then backfilling the trench with an oxide or other suitable dielectric such as $Si_3N_4$.

A gate dielectric layer 207 is then formed on the surface of semiconductor layer 203. The gate dielectric layer 207 may comprise, for example, a nitrided oxide layer which will preferably be formed to a thickness of between 5 and 30 Å, and more preferably to a thickness of about 11 Å. The gate dielectric layer may also comprise a metal oxide such as $HfO_2$ or $ZrO_2$.

A gate electrode 209 is formed on the gate dielectric layer 207. The gate electrode 209 has a thickness which is typically within the range of about 500 to about 3,500 Å. The gate electrode 209 may be formed by blanket deposition of a layer of poly-crystalline Si, which is then patterned utilizing photolithographic techniques as are known to the art. The gate electrode 209 may also comprise various metals, including, but not limited to, MoN, TaC, TiN, and TaN.

As illustrated in FIG. 5, the structure is subjected to a first ion implantation step, which may utilize either p-dopant or n-dopant ions. Various materials may be used to generate the ions. For example, if p-dopant ions are used, the p-dopant ions may be formed from indium, gallium, boron, or compounds of these elements, such as $BF_2$, $B_{18}H_{22}$, $B_{10}H_{14}$. This results in the formation of conductive shallow doped extension implant regions 211 and 213 in the exposed surface of semiconductor layer 203, and in the formation of a conductive doped implant region 215 in the exposed upper surface of the gate electrode 209. In the resulting structure, the implant regions 211 and 213 are located on opposing sides of the gate electrode 209 and adjacent thereto, and are spaced apart from one another by the width of the gate electrode 209.

Figure 6:
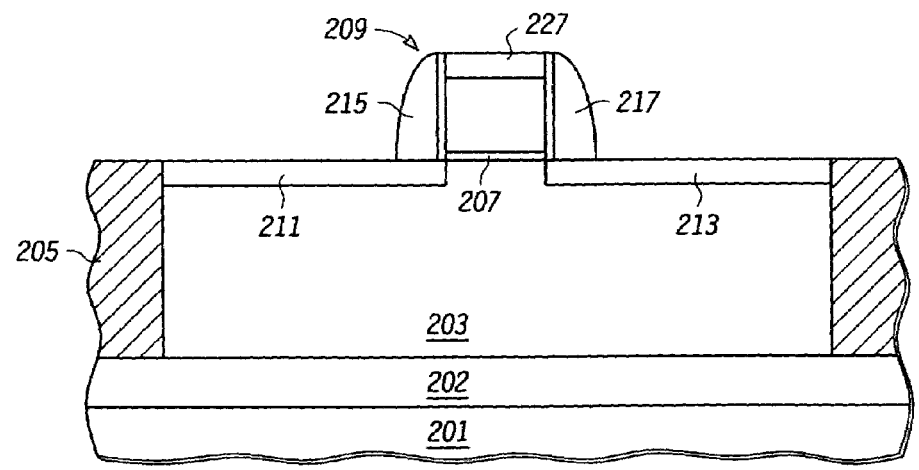
FIG. 6 is an illustration of one step in a method for making a transistor with a strained channel layer in accordance with the teachings herein.

As shown in FIG. 6, spacer structures 215, 217 are then formed on opposing sides of the gate electrode 209. The spacer structures 215, 217 cover the sides of the gate electrode 209, and also cover a portion of the surface of the semiconductor layer 203 (and more particularly, a portion of the shallow implant regions 211, 213) adjacent to the gate electrode 209. In the particular embodiment illustrated, the spacer structures 215, 217 have a rounded geometry as a result of the particular deposition and etch-back processes used in their formation. It will be appreciated, however, that the specific geometry and dimensions of the spacers will often be dictated by the particular design, specifications and desired properties of the semiconductor device, and hence the geometry of the spacer structures may vary. For example, in many applications, the use of L-shaped spacer structures is advantageous. The formation of spacer structures is well known in the art, and typically involves deposition of one or more layers of the spacer materials, followed by an etch-back using suitable photolithographic techniques.

Figure 7:
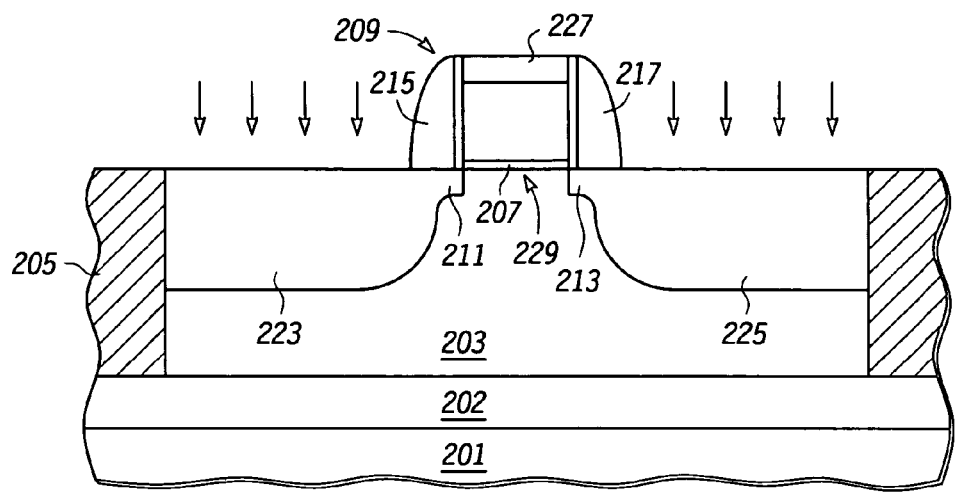
FIG. 7 is an illustration of one step in a method for making a transistor with a strained channel layer in accordance with the teachings herein.

As illustrated in FIG. 7, the upper surfaces of the gate electrode 209 and the surface of the semiconductor layer 203 may be subject to a further implantation step, which may again involve the use of p-dopant or n-dopant ions. The dopant material utilized in this sacrificial ion implantation is preferably the same type of dopant material used in the implantation step shown in FIG. 5. The implantation energy of the second implantation step is typically increased as compared to the implantation energy of the first implantation step depicted in FIG. 5 so that the dopant ions will implant deeper into the semiconductor layer 203. The spacer structures 215 and 217 form an implant mask which prevents implantation of the ions into the portion of the semiconductor layer 203 disposed beneath the spacer structures 215 and 217. The second implantation step results in the formation of deep, conductive doped implant regions 223 and 225 in the semiconductor layer 203, and also results in the formation of a deeper doped region 227 in the gate electrode 209. A shallow channel 229 resulting from the implantation step of FIG. 5 is defined between the inner edges of shallow implant regions 211 and 213.

Figure 8:
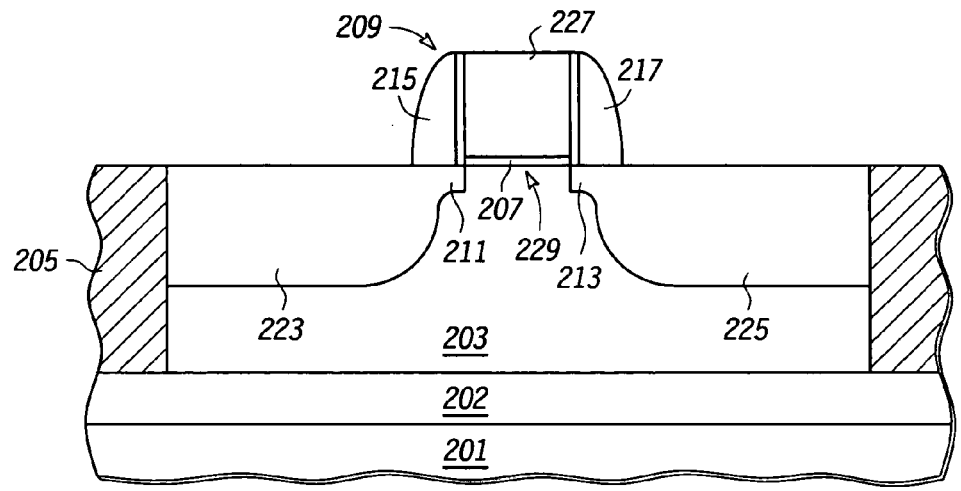
FIG. 8 is an illustration of one step in a method for making a transistor with a strained channel layer in accordance with the teachings herein.

The structure of FIG. 7 may be subjected to an optional annealing process. The attendant heating of the annealing process causes diffusion of the shallow implant regions 211 and 213 and deep implant regions 223 and 225 into semiconductor layer 203. As shown in FIG. 8, this diffusion causes the lower edges of the deep implant regions 223 and 225 to migrate further downward into the semiconductor layer 203.

In some embodiments, the annealing process may also be used to adjust the position of the inner tips of the shallow implant regions 211 and 213 below the gate electrode 209. The doped region 227 in the gate electrode 209 may diffuse down to the gate dielectric layer 207 during the annealing process.

Figure 9:
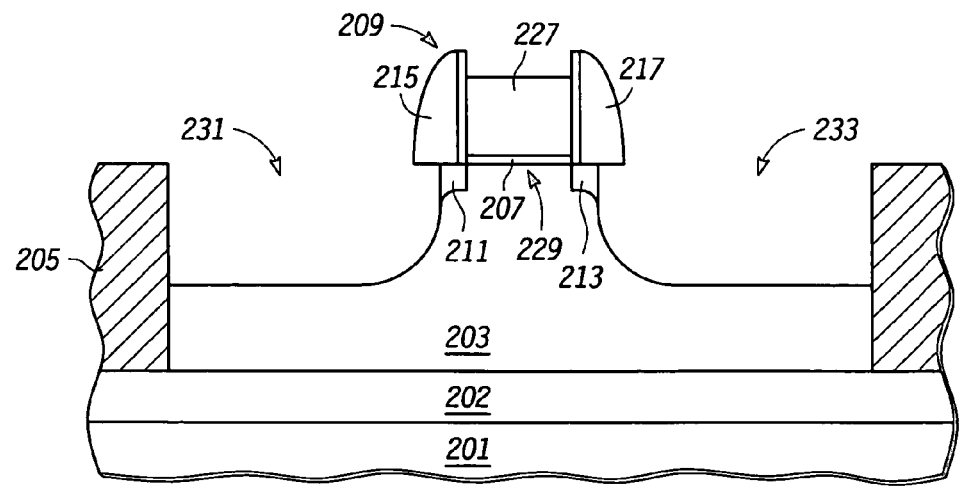
FIG. 9 is an illustration of one step in a method for making a transistor with a strained channel layer in accordance with the teachings herein.

FIG. 9 depicts the structure of FIG. 8 after a selective (preferably dry) etch is used to remove at least a portion of implant regions 223 and 225, thus resulting in the formation of trenches 231 and 233. In the particular embodiment depicted, the dry etch is shown as removing implant regions 223 and 225 in their entirety, although more generally, the boundaries of trenches 231 and 233 may exceed, or may be within, the initial boundaries of implanted regions 223 and 225. The inner edges of the trenches 231 and 233 are typically aligned somewhere between the inner and outer edges of spacer structures 215 and 217. However, since some lateral undercutting by the subsequently formed source 235 and drain 237 regions (see FIG. 11) is often preferred in the vicinity of the gate dielectric 207, a portion of the shallow implant regions 211 and 213 may be retained in this area.

After the dry etch is completed, the outer edges of the recesses 231 and 233 coincide with the surfaces of the field isolation regions 205. An upper portion of the gate electrode 209 is also removed during the etching process. Since the source 235 and drain 237 regions (see FIG. 11) will be subsequently formed through epitaxy, the exposed surfaces of recesses 231 and 233 preferably comprise a monocrystalline semiconductor material. As indicated in FIG. 9, the etching of implant regions 223 and 225 may occur at a faster rate than the etching of gate electrode 209, thus creating the potential for distortion of the gate electrode profile in the subsequent epitaxial growth step.

Figure 10:
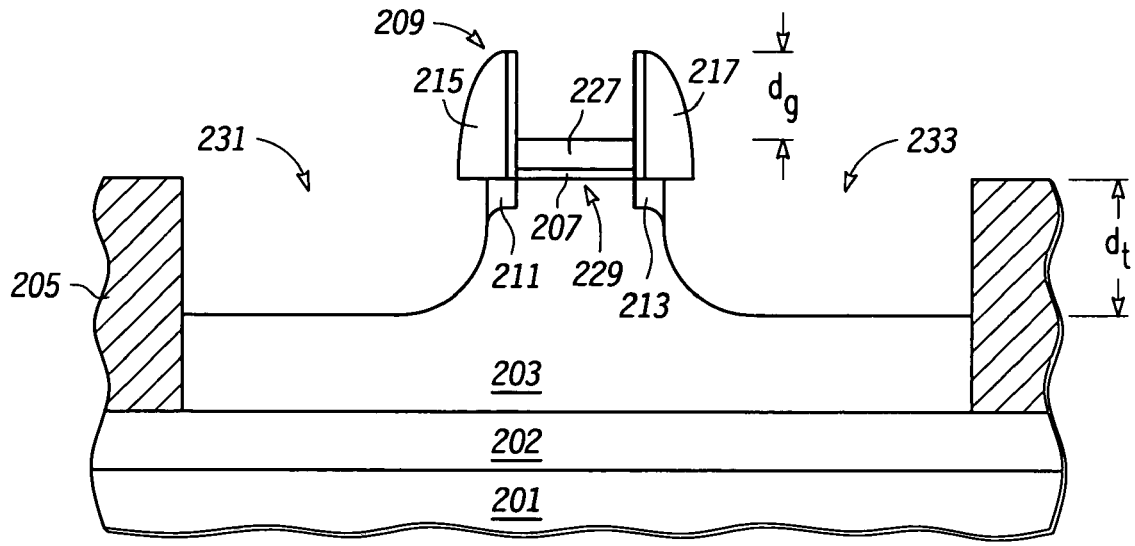
FIG. 10 is an illustration of one step in a method for making a transistor with a strained channel layer in accordance with the teachings herein.
Figure 11:
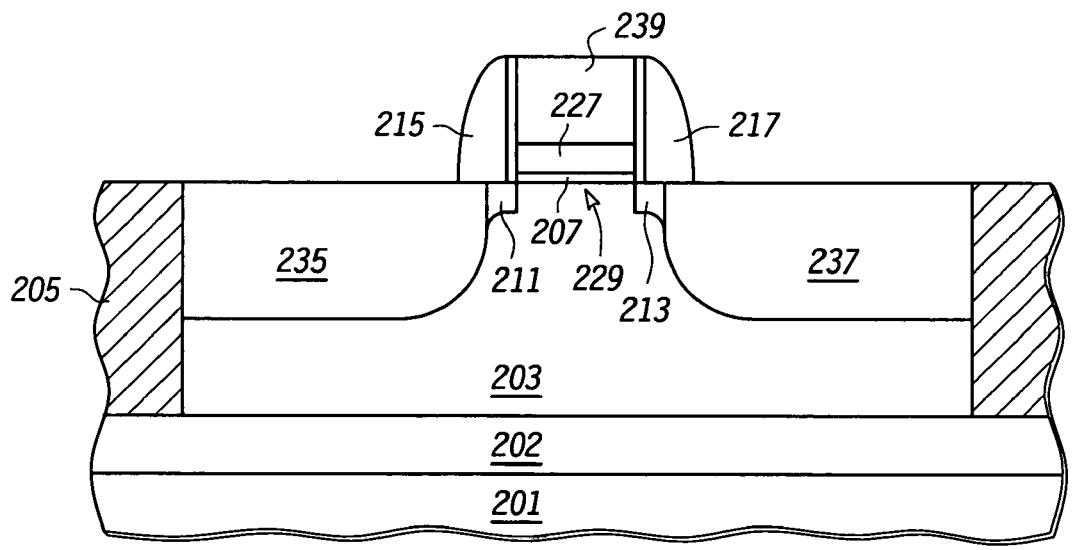
FIG. 11 is an illustration of one step in a method for making a transistor with a strained channel layer in accordance with the teachings herein.

In order to prevent this from happening, the structure is subjected to a second etch as shown in FIG. 10 which preferentially etches the gate electrode 209. This second etch is preferably accomplished in an epitaxial chamber with a hot HCl gaseous etchant. Such an etchant etches the (typically polycrystalline) gate electrode 209 at a much faster rate than it etches the (typically monocrystalline) implant regions 223 and 225. The extent (e.g., duration) of the second etch is controlled such that the maximum depth $d_r$ of the trenches 231 and 233 is preferably essentially equal to, or somewhat less than, the depth $d_g$ of the trench 234 formed in the gate electrode 209. As a result, as shown in FIG. 11, when the structure is subjected to epitaxial film growth with similar growth rates of the source/drain regions 235, 237 and the gate electrode 209, the gate electrode 209 does not extend above the adjacent spacer structures 215, 217. Hence, distortion of the gate electrode profile is avoided. In the case where the film growth rates of the source/drain regions 235, 237 and the gate electrode 209 differ, the etch times for the first and second etch steps can be monitored to reach an final depth ratio of the gate trench 234 to the source trench 231 and/or drain trench 233 that is close to the corresponding ratio of the film growth rates in these regions. Under such conditions, no distortion of the gate electrode profile takes place.

In the foregoing embodiment, the semiconductor material of the source 235 and drain 237 regions is preferably distinct from the semiconductor material of the semiconductor layer 203. Even more preferably, the semiconductor material of the semiconductor layer 203 has a larger or smaller lattice spacing than the semiconductor material of the source 235 and drain 237 regions, depending on whether compressive or tensile strain in the channel layer of the device is desired. However, it is to be noted that the methodologies described herein may also be applied to devices that do not have a strained channel.

In some embodiments of the methods described herein, the etch that is used to create the trenches 231 and 233 for the source 235 and drain 237 regions, and the etch used to create the trench 234 in the gate electrode, may be controlled (as, for example, through suitable masking) to operate on only one of these regions at a time. For example, a first suitable etch may be used to define the trenches 231 and 233 for the source 235 and drain 237 regions, and may be used in conjunction with an etch mask that masks the gate electrode 209. A second etch, which may be the same as or different from the first etch, may then be used to define the trench 234 in the gate electrode 209, and may be used in conjunction with an etch mask that masks the source 235 and drain 237 regions (or the regions of the semiconductor layer 203 in which the source 235 and drain 237 regions are ultimately formed). The duration and/or conditions of the first and second etches may be controlled to produce a trench 234 in the gate electrode 209 which permits refilling of the trenches 231 and 233 without the occurrence of gate mushrooming.

In other embodiments, separate epitaxial growth steps (each associated with a separate mask) may be used to define the source 235 and drain 237 regions and region 227 of the gate electrode. Such an approach allows the growth of the source 235 and drain 237 regions to be decoupled from the growth of region 227 of the gate electrode 209 so that distortion of the gate electrode profile can be avoided.

In some embodiments, one or more barrier layers may be formed on the surface of the trenches 231 and 233. Such barrier layers may comprise, for example, SiGeC, GeC, SiC, Si, SiGe or other suitable materials, and may be formed on the exposed surfaces of semiconductor layer 203, preferably through a suitable epitaxial growth process. The barrier layers in the trenches 222 and 224 preferably comprise the same material and are formed simultaneously, though in some embodiments they may comprise diverse materials and may be formed in separate processing steps. In the event that barrier layers are used, the source 235 and drain 237 regions are subsequently formed on the barrier layers 222 and 224 in the trenches 231 and 233, as by selective epitaxial growth or through another suitable process.

While the source 235 and drain 237 regions are shown in FIG. 11 as being level with the tops of the field isolation regions 205, it will be appreciated that, in some embodiments, the source 235 and drain 237 regions may protrude above the field isolation regions 205, or may be lower than the field isolation regions 205. In such cases, the etch which is used to preferentially etch the gate electrode 209 may be adjusted accordingly, if necessary. Moreover, in some embodiments, the source 235 and drain 237 regions may be capped with a layer of SiGe/Si. If an epitaxial growth process is used to form the source 235 and drain 237 regions, formation of such a cap layer may be accomplished, for example, by adjusting the process gases at the end of the epitaxial growth process.

The source 235 and drain 237 regions preferably comprise a semiconductor material, such as, for example, silicon, germanium, or SiGe, which is doped with a suitable dopant by ion implantation, in situ doping, or by another suitable process. Depending on the choice of materials for the semiconductor layer 203 or the barrier layers (if used), the material of the source 235 and drain 237 regions can be made to have a lattice structure which replicates the lattice structure of the semiconductor layer 203 (or, if applicable, the lattice structure of the intervening barrier layer) but which has a larger or smaller lattice spacing, at least in a relaxed state. If the source 235 and drain 237 regions have larger lattice spacings than the semiconductor layer 203, the source 235 and drain 237 regions create a compressive stress in the shallow channel region 229. Such an embodiment may be achieved, for example, by employing single crystal germanium in the semiconductor layer 203, and a Si—Ge compound in the source 235 and drain 237 regions.

Alternatively, the materials for the source 235 and drain 237 regions, the semiconductor layer 203, and/or any intervening barrier layers may be chosen such that the lattice spacing of the source 235 and drain 237 regions is smaller than the lattice spacing of the semiconductor layer and/or any intervening barrier layers. Such an embodiment may be achieved, for example, by utilizing source and drain films of silicon which include carbon, in conjunction with a semiconductor layer 203 comprising single crystal germanium. The silicon and carbon form a compound which has a crystal lattice with the same structure as the lattice structure of the single crystal germanium layer 203, but with a smaller spacing. The source and drain films will thus tend to contract, thereby creating a tensile stress in the channel 229.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
providing a semiconductor structure comprising a substrate with a gate structure disposed thereon, wherein the gate structure comprises a gate electrode and at least one spacer structure, and wherein the substrate comprises a first semiconductor material;
creating a first trench in the substrate through the use of a first etch, the first trench being adjacent to the gate structure; and etching the gate electrode with a second etch, and wherein the first etch is a dry etch, and wherein the second etch is a wet etch.

2. The method of claim 1, wherein the minimum cumulative reduction in thickness of the gate electrode from the first and second etches is $d_g$, wherein the maximum depth of the first trench after the first and second etches is $d_t$, and wherein $d_g \geq d_t$.

3. The method of claim 1, wherein the first etch primarily etches the substrate, and wherein the second etch primarily etches the gate electrode.

4. The method of claim 1, further comprising:
epitaxially growing a second semiconductor material in the first trench.

5. The method of claim 4, wherein the step of epitaxially growing the second semiconductor material on the first semiconductor material also results in the growth of the second semiconductor material on the gate electrode.

6. The method of claim 4, wherein the maximum height of the gate electrode after the growth of the second semiconductor material is not greater than the maximum height of the gate electrode prior to the first etch.

7. The method of claim 4, wherein the second semiconductor material has a larger lattice spacing than the first semiconductor material.

8. The method of claim 7, wherein the first semiconductor material is silicon, and wherein the second semiconductor material is SiGe.

9. The method of claim 1, further comprising depositing a barrier layer of a first semiconductor material in the first trench.

10. The method of claim 1, wherein the second etch is conducted in an epitaxial chamber.

11. The method of claim 10, wherein the second etch comprises treatment with hot gaseous HCl.

12. The method of claim 1, wherein the first etch also creates a second trench adjacent to the gate structure.

13. The method of claim 1, wherein the gate electrode is covered with an etch mask during the first etch.

14. The method of claim 1, wherein the first trench is covered with an etch mask during the second etch.

15. A method for making a semiconductor device, comprising:
- providing a semiconductor device comprising a substrate with a gate structure disposed thereon, the gate structure comprising a gate electrode and at least one spacer structure;
- creating first and second trenches in the substrate on first and second sides of the gate electrode, respectively, through the use of a first etch; and
- etching the gate electrode with a second etch;

wherein the minimum cumulative reduction in thickness of the gate electrode from the first and second etches is $d_g$, wherein the maximum depth of the first and second trenches after the first and second etches is $d_t$, and wherein $d_g \geq d_t$.

16. The method of claim 15, wherein the substrate comprises a first semiconductor material, and further comprising epitaxially growing a second semiconductor material in the first trench.

17. The method of claim 16, wherein the step of epitaxially growing the second semiconductor material on the first semiconductor material also results in the growth of the second semiconductor material on the gate electrode.

18. The method of claim 15, wherein the maximum height of the gate electrode after the growth of the second semiconductor material is not greater than the maximum height of the gate electrode prior to the first etch.

19. The method of claim 16, wherein the first etch is a dry etch, and wherein the second etch comprises treatment with gaseous HCl in an epitaxial chamber.

* * * * *